United States Patent
Maeda

(10) Patent No.: US 6,923,361 B2
(45) Date of Patent: Aug. 2, 2005

(54) BONDING APPARATUS

(75) Inventor: Tooru Maeda, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 67 days.

(21) Appl. No.: 10/444,368

(22) Filed: May 23, 2003

(65) Prior Publication Data

US 2003/0218048 A1 Nov. 27, 2003

(30) Foreign Application Priority Data

May 23, 2002 (JP) ........................................ 2002-148480

(51) Int. Cl.[7] ............................. B23K 1/06; B23K 5/20; B23K 37/00
(52) U.S. Cl. ......................... 228/1.1; 228/4.5; 228/180.5
(58) Field of Search .......................... 228/1.1, 4.5, 180.5

(56) References Cited

U.S. PATENT DOCUMENTS

| | | | | |
|---|---|---|---|---|
| 3,328,875 A | * | 7/1967 | Pennings | 228/111 |
| 4,266,710 A | * | 5/1981 | Bilane et al. | 228/4.5 |
| 5,156,318 A | * | 10/1992 | Suzuki et al. | 228/4.5 |
| 5,395,038 A | * | 3/1995 | Olson et al. | 228/180.5 |
| 6,176,414 B1 | * | 1/2001 | Sadler | 228/1.1 |
| 6,382,494 B1 | * | 5/2002 | Miller | 228/1.1 |
| 6,398,098 B1 | * | 6/2002 | Kada | 228/4.5 |
| 2003/0076661 A1 | * | 4/2003 | Murata et al. | 361/760 |

FOREIGN PATENT DOCUMENTS

| JP | 4-317343 | 11/1992 |
|---|---|---|
| JP | 5-74838 | 3/1993 |
| JP | 10-74785 | 3/1998 |

* cited by examiner

Primary Examiner—Lynne R. Edmondson
(74) Attorney, Agent, or Firm—Koda & Androlia

(57) ABSTRACT

A bonding apparatus including: a horn holder pivotably connected at a first connecting portion to a bonding head, an ultrasonic horn having a capillary and held in the horn holder, a linking arm pivotably connected at a second connecting portion to the horn holder and pivotably connected at a third connecting portion to the bonding head, and a driving motor that moves the first connecting portion horizontally or causes the third connecting portion to pivot; and a relationship $L1=L2=L3$ being established, in which $L1$ is a distance between the third connecting portion and the second connecting portion, $L2$ is a distance between the second connecting portion and the tip end of the capillary, and $L3$ is a distance between the second connecting portion and the first connecting portion.

6 Claims, 5 Drawing Sheets

CD=L1
AD=L2
BD=L3

BONDING APPARATUS

BACKGROUND OF THE INVENTION

1. Field of the Invention

The present invention relates to a bonding apparatus and more particularly to a bonding apparatus which is suitable for use in bonding a workpiece that has a large bonding area.

2. Prior Art

Wire bonding apparatuses that performs bump formation or wire connections, etc. are generally divided into the two main types.

The first main type is a vertically driven type. In this vertically driven type, a slider is disposed on a linear guide that has a vertical guide so that the slider can move upward and downward, an ultrasonic horn that has a capillary is attached to a horn holder, and the horn holder is attached to the slider.

An example of such a vertically driven type apparatus is described in Japanese Patent No. 3220483 (Laid-Open No. H05-74838).

The second main type is a supporting-point swinging type. In this supporting-point swinging type, an ultrasonic horn which has a capillary is attached to a horn holder. The horn holder is caused to swing about the supporting point of a cruciform plate spring that supports the horn holder, or the horn holder is fastened to a supporting shaft which is rotatably supported so that the horn holder is caused to swing about this supporting shaft.

Examples of such a supporting-point swinging type apparatus are described in Japanese Patent No. 2814154 (Laid-Open No. H04-317343), Japanese Patent No. 2860650 (Laid-Open No. H10-74785), etc.

In the vertically driven type, the length of the linear guide must be sufficient enough so that the capillary contacts the workpiece, and the linear guide is extended downward from the horizontal plane of the bonding surface of the workpiece. Accordingly, the workpiece is limited to a size that does not contact the linear guide. Furthermore, since such components as the ultrasonic horn, horn holder, slider, etc. which are heavy are caused to move upward and downward, the inertia is large when these elements are driven at a high speed, and bonding of small balls is especially difficult.

In the supporting-point swinging type, when the capillary is in contact with a workpiece, the capillary must be perpendicular to the workpiece. Accordingly, the supporting point or supporting shaft that constitutes the center of rotation of the horn holder is set to be at the same height as the tip end of the capillary. Consequently, the horn holder and the supporting point or supporting shaft are positioned on a horizontal plane of the bonding surface of the workpiece, so that the size of the workpiece is, like in the above-described vertically driven type, limited. Furthermore, since the capillary swings about the supporting point or supporting shaft, a correction in the forward-rearward direction (the axial direction of the ultrasonic horn) is necessary in order to raise and lower the capillary more or less perpendicularly.

SUMMARY OF THE INVENTION

It is, therefore, an object of the present invention to provide a bonding apparatus that raises and lowers a capillary perpendicularly or substantially perpendicularly with respect to the bonding surface.

It is another object of the present invention to provide a bonding apparatus that performs bonding to a workpiece that has a large bonding area.

The above objects are accomplished by a unique structure of the present invention for a bonding apparatus that comprises: a horn holder, one end of this horn holder having a first connecting portion that is movable in a horizontal direction and is connected to a bonding head in a pivotable fashion, and another end of the horn holder being inclined downward and forward, an ultrasonic horn which has a capillary at its one end and is held by the horn holder, a linking arm, one end of this linking arm having a second connecting portion that is connected to the horn holder in a pivotable fashion, and another end of the linking arm having a third connecting portion that is connected to the bonding head so that the third connecting portion is pivotable with respect to the bonding head, and a driving motor that moves the first connecting portion horizontally or causes the third connecting portion to pivot; and in this structure,

- the second connecting portion is disposed on an imaginary line that connects a tip end of the capillary and the first connecting portion,
- the third connecting portion is disposed on a imaginary horizontal line that passes through the first connecting portion, and
- a relationship $L1=L2=L3$ is established, in which $L1$ is a distance between the third connecting portion and the second connecting portion, $L2$ is a distance between the second connecting portion and the tip end of the capillary, and $L3$ is a distance between the second connecting portion and the first connecting portion.

The above objects are accomplished by another unique structure of the present invention for a bonding apparatus that comprises: a horn holder, one end of this horn holder having a first connecting portion that is movable in a horizontal direction and is connected to a bonding head in a pivotable fashion, and another end of the horn holder being inclined downward and forward, an ultrasonic horn which has a capillary at its one end and is held by the horn holder, a linking arm, one end of this linking arm having a second connecting portion that is connected to the horn holder in a pivotable fashion, and another end of the linking arm having a third connecting portion that is connected to the bonding head so that the third connecting portion is pivotable with respect to the bonding head, and a driving motor that moves the first connecting portion horizontally or causes the third connecting portion to pivot; and in this structure,

- the second connecting portion is disposed on an imaginary line that connects a tip end of the capillary and the first connecting portion,
- the third connecting portion is disposed on a imaginary horizontal line that passes through the first connecting portion, and
- a relationship $L1:L3=L3:L2$ is established, in which $L1$ is a distance between the third connecting portion and the second connecting portion, $L2$ is a distance between the second connecting portion and the tip end of the capillary, and $L3$ is a distance between the second connecting portion and the first connecting portion.

In the present invention, the bonding apparatus can be further provided with an initial position setting means that allows an initial position of the first connecting portion or of the third connecting portion, which are driven by the driving motor, to be set freely.

In addition, the initial position setting means is comprised of:

- an initial position detection member which is disposed on a member that is driven together with the first connecting portion or the third connecting portion, and a sensor which is provided on the bonding head at a position that corresponds to the initial position detection member.

DETAILED DESCRIPTION OF THE INVENTION

The first embodiment of the present invention will be described with reference to FIGS. 1 through 3.

Figure 1:
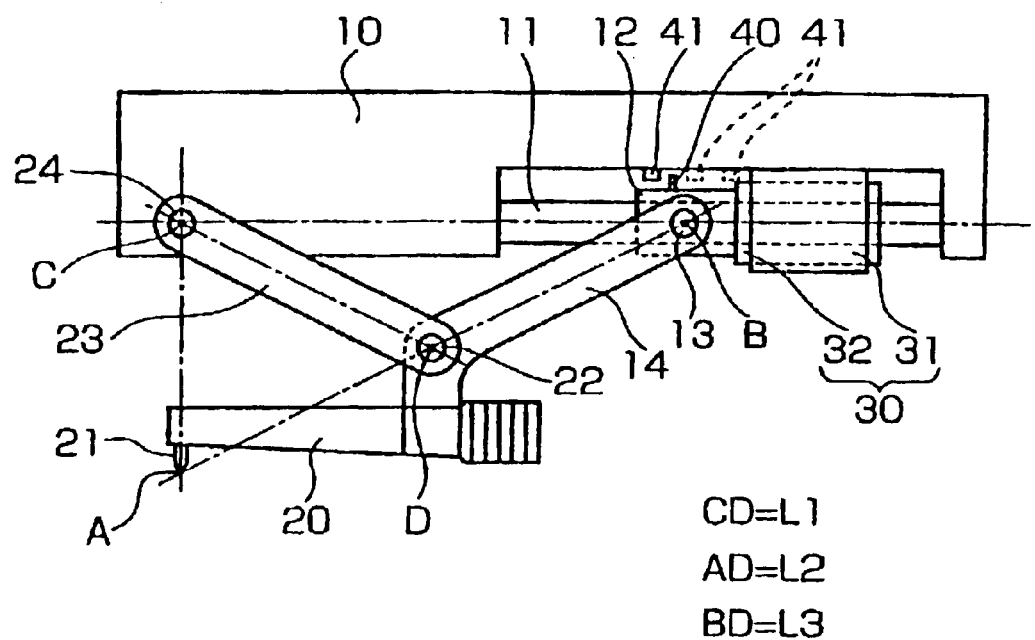
FIG. 1 is a side view of the first embodiment of the bonding apparatus according to the present invention.

FIG. 1, the upper surface of a bonding head 10 is fastened to an XY table (not shown) which is driven in the directions of the X and Y axes. This XY table is fastened to the roof of the stand (not shown) of a bonding apparatus. In other words, the bonding head 10 has a suspended structure. Both ends of a horizontally disposed guide shaft 11 are fastened to the bonding head 10, and a linear bush 12 is fitted over the guide shaft 11 so that the linear bush 12 is free to slide or slidable. A first supporting shaft 13, which is a cross guide bearing, is fastened to the linear bush 12, and a horn holder 14 which extends forward at an inclination is supported on the first supporting shaft 13 so that the horn holder 14 is free to pivot or pivotable.

A rear-end vibration node portion of the ultrasonic horn 20 is fastened to the lower end portion of the horn holder 14. A capillary 21 is fastened to the end portion of the ultrasonic horn 20, and a wire (not shown) wound around a wire spool (not shown) passes through the capillary 21. One end of a linking arm 23 is supported via a second supporting shaft 22 on a portion of the horn holder 14 that is located on an imaginary line connecting the tip end A of the capillary 21 and the center B of the first supporting shaft 13, so that the linking arm 23 is pivotable. The other end of the linking arm 23 is supported via a third supporting shaft 24 on the side surface of the bonding head 10 on the imaginary horizontal line that passes through the first supporting shaft 13, so that the linking arm 23 is pivotable. In other words, the line segment BC that connects the center B of the first supporting shaft 13 and the center C of the third supporting shaft 24 is on a horizontal line.

A driving motor 30 which drives the linear bush 12 in the horizontal direction is fastened to the bonding head 10. The driving motor 30 is, as well known in prior art, comprised of a coil 31 and a magnet 32. The coil 31 is fastened to the bonding head 10, and the magnet 32 is fitted over the guide shaft 11 and fastened to the linear bush 12. It goes without saying that when the driving motor is of a type that includes the coil 31 provided on the inside and the magnet 32 provided on the outside, then the coil 31 can be fastened to the linear bush 12, and the magnet can be fastened to the bonding head 10.

Figure 2:
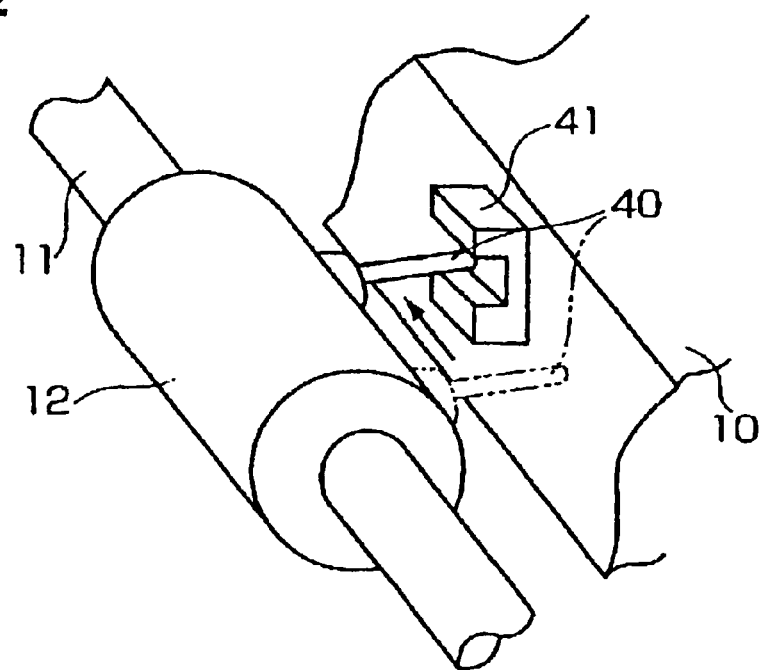
FIG. 2 is a perspective explanatory diagram that shows the initial position setting means.
Figure 3:
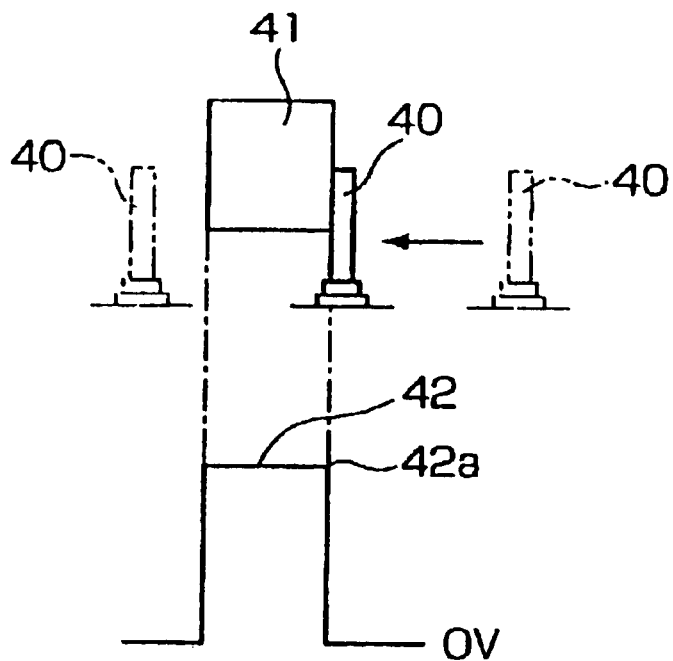
FIG. 3 is an explanatory diagram that shows the manner of setting the initial position.

As seen from FIGS. 1 and 2, an initial setting pin 40 is fastened to the linear bush 12 as an initial position setting means that sets the initial position of the first supporting shaft 13 driven by the driving motor 30. A sensor 41, which is a photo-interrupter, for instance, for detecting the initial setting pin 40 is fastened to the bonding head 10. The sensor 41 shown by dotted lines in FIG. 1 indicates a case in which the position of attaching the bonding head 10 is altered.

First, the initial position of the first supporting shaft 13 is set. As shown in FIG. 3, when the initial setting point 40 passes the sensor 41, an output signal 42 is output from the sensor 41. The edge signal 42a of this output signal 42 is set as the initial position. In cases where the initial position of the driving of the first supporting shaft 13 is to be adjusted or altered, it is necessary to alter the fastening angle of the ultrasonic horn 20 and horn holder 14 so that the capillary 21 held in the ultrasonic horn 20 is perpendicular. Accordingly, the connection between the ultrasonic horn 20 and the horn holder 14 is accomplished by means of screws, etc., so that the fastening angle is adjustable. The relationship between the amount of movement of the driving motor 30 (which is the driving angle θ of the horn holder 14) and the amount of vertical movement of the tip end A of the capillary 21, i.e., the gain, can be varied by varying the initial position of the driving motor 30; accordingly, the optimal gain can be set.

The detection of the initial position is accomplished as follows: Since hysteresis exists as a result of the width of the initial setting pin 40, etc., the edge signal 42a of the output signal 42 of the sensor 41 is set as the initial position, by causing the initial setting pin 40 to always advance toward in a fixed direction, e.g., toward the sensor 41 from the right side, as shown in FIG. 3. The edge signal of the signal is also set as the initial position in cases where the sensor 41 outputs a falling signal. In FIG. 1, the initial position of the first supporting shaft 13 is changed by way of altering the position in which the sensor 41 is fastened to the bonding head 10 as shown by the dotted lines.

In the structure described above, where L1 is the distance from the center C of the third supporting shaft 24 to the center D of the second supporting shaft 22, L2 is the distance from the tip end A of the capillary to the center D of the second supporting shaft 22, and L3 is the distance from the center B of the first supporting shaft 13 to the center D of the second supporting shaft 22, then the linking arm 23, the ultrasonic horn 20 and the horn holder 14 (or the lengths L1, L2 and L3) are connected by distances and dispositions that satisfy the relationship L1:L3=L3:L2. In the shown embodiment, L1:L3=L3:L2=1:1. In other words, L1=L2=L3.

As described above, the line segment BC is on a horizontal line, the center D is on the line segment AB, and L1=L2=L3. Accordingly, in the shown embodiment, the center C is on the vertical imaginary line of the tip end A of the capillary, and the triangle ABC is a right triangle in which the center C is the right angle. Consequently, even if the center B is moved horizontally, the center C of the triangle ABC keeps the right angle, and the tip end A of the capillary is always moved vertically.

Accordingly, when the linear bush 12 is moved leftward or rightward along the guide shaft 11 by the driving motor 30, the second supporting shaft 22 is moved downward or upward, and the tip end A of the capillary 21 is moved vertically downward or upward and is not moved in the direction of the Y axis (i.e., in the direction of the axial center of the ultrasonic horn 20).

In the shown embodiment, the horn holder 14, linking arm 23, supporting shafts 13, 22 and 24 and driving motor 30 are disposed above the ultrasonic horn 20, so that no members that support or drive the ultrasonic horn 20 are present on the horizontal plane of the tip end A of the capillary 21, i.e., the horizontal plane of the bonding surface of the workpiece. Accordingly, workpieces with a large bonding area can be bonded. In other words, it is possible to perform bonding on a workpiece that has a large bonding area.

The second embodiment of the present invention will be described with reference to FIG. 4. The elements which are the same as in the above-described first embodiment or which correspond to the elements of the first embodiment are labeled with the same reference numerals, and a detailed description of such elements is omitted.

Though in the above-described first embodiment, the linear bush 12 is caused to move horizontally by the driving motor 30, in the second embodiment, the third supporting shaft 24 is fastened to the linking arm 23, and this third supporting shaft 24 is caused to pivot by a driving motor 35 which is fastened to the bonding head 10. Furthermore, the initial setting pin 40 is fastened to the linking arm 23, and the sensor 41 is fastened to the bonding head 10 in a position facing the linking arm 23. The remaining construction is the same as in the above-described first embodiment.

In the above structure, when the linking arm 23 is caused to pivot by the driving motor 35, the linear bush 12 is moved horizontally along the guide shaft 11. Accordingly, an effect substantially the same as that of the above-described first embodiment is obtained without any need to describe the details.

Figure 5:
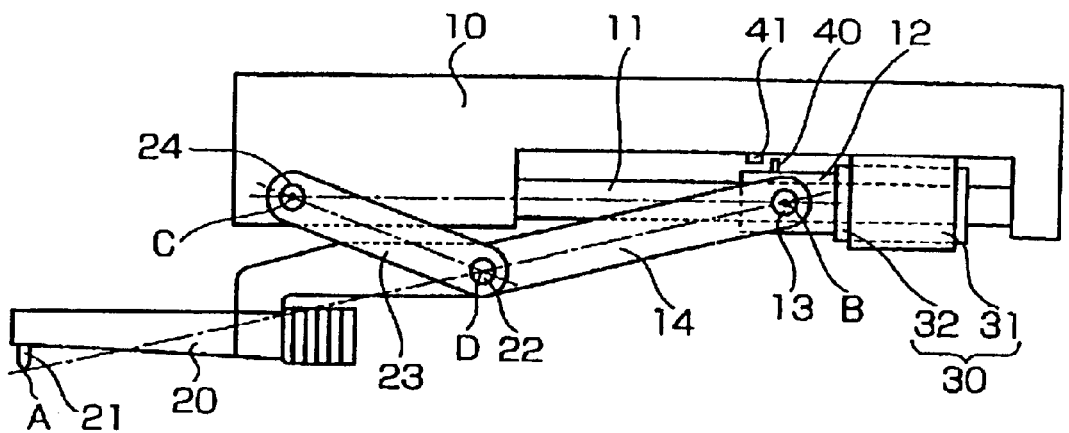
FIG. 5 is a side view of the third embodiment of the bonding apparatus according to the present invention.
Figure 6:
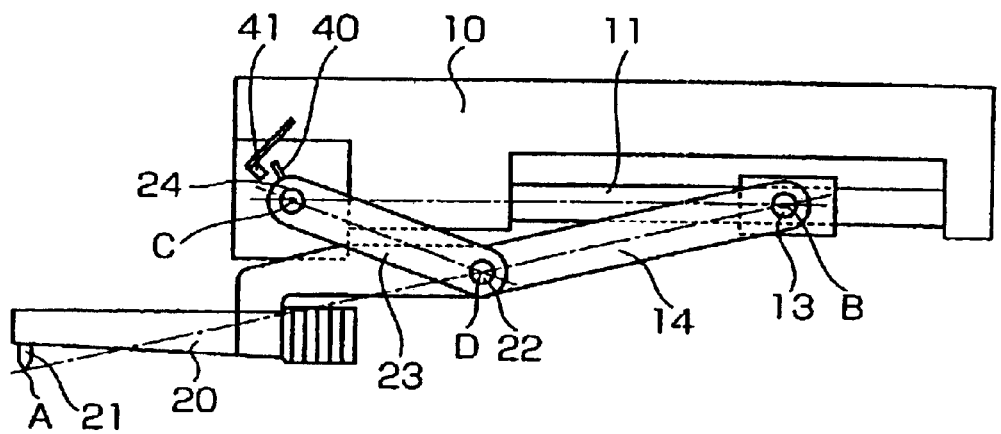
FIG. 6 is a side view of the fourth embodiment of the bonding apparatus according to the present invention.

Third and fourth embodiments of the present invention are illustrated in FIGS. 5 and 6. The elements which are the same as in the above-described first and second embodiment or which correspond to the elements of the first embodiment are labeled with the same reference numerals, and a detailed description of such elements is omitted.

Figure 4:
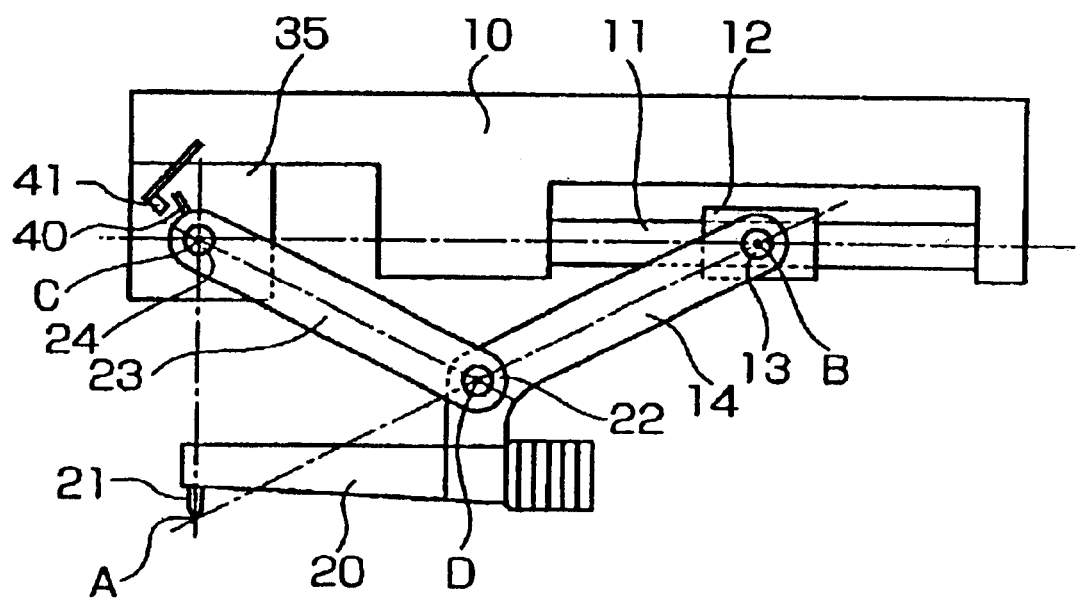
FIG. 4 is a side view of the second embodiment of the bonding apparatus according to the present invention.

In FIG. 5, the linear bush 12 is driven by a driving motor 30 in the same manner as in the above-described first embodiment (FIG. 1); and in FIG. 6, the third supporting shaft 24 is driven by a driving motor 35 in the same manner as in the above-described second embodiment (FIG. 4). In the respective first and second embodiments, the linking arm 23, the ultrasonic horn 20 and the horn holder 14 (or the lengths L1, L2 and L3) are connected by distances and dispositions which are such that these dimensions have the relationship L1:L3=L3:L2, and L1:L3=L3:L2=1:1. In the third and fourth embodiments, the linking arm 23, the ultrasonic horn 20 and the horn holder 14 (or the lengths L1, L2 and L3) are connected by distances and dispositions which satisfy only the condition L1:L3=L3:L2; and the remaining structure is the same as in the first and second embodiments described above.

Figure 7:
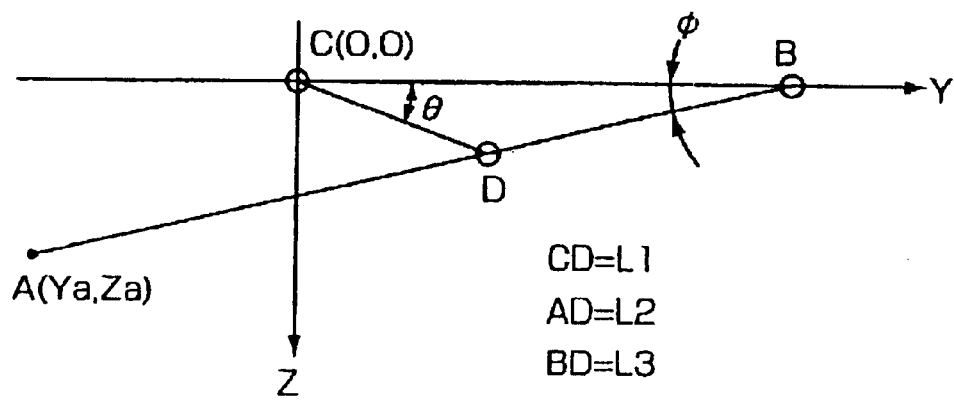
FIG. 7 is a diagram that illustrates the operating principle of the tip end of the capillary in the respective embodiment of FIGS. 5 and 6.

Accordingly, in the triangle CBD shown in FIG. 7, the coordinate Ya of the tip end of the capillary in the direction of the Y axis and the coordinate Za of the tip end of the capillary in the direction of the Z axis are expressed by Numerical Expression 1 below, wherein θ is the angle of the center C, φ is the angle of the center B, the center C is the origin of the coordinate system, the horizontal direction in the direction of the axial center of the ultrasonic horn 20 is taken as the Y axis, and the height direction is taken as the Z axis. When these coordinates Ya and Za are expressed as a function of the angle θ of the linking arm 23, then the following is obtained: since $L1 \cdot \sin\theta = L3 \cdot \sin\phi$, $\sin\phi = (L1/L3)\sin\theta$. Consequently, the angle φ can be expressed by Numerical Expression 2 below. If Numerical Expression 2 is substituted into Numerical Expression 1, Ya and Za can be expressed by Numerical Expression 3 below.

$Ya = L1 \cdot \cos\theta - L2 \cdot \cos\theta$ $Za = (L2+L3)\sin\theta$      Numerical Expression 1

$\phi = \sin^{-1}\{(L1/L3)\sin\theta\}$      Numerical Expression 2

$Ya = L1 \cdot \cos\theta - L2 \cdot \cos[\sin^{-1}\{(L1/L3)\sin\theta\}]$      Numerical Expression 3

$Za = (L2+L3) \cdot (L1/L3)\sin\theta$

Figure 8:
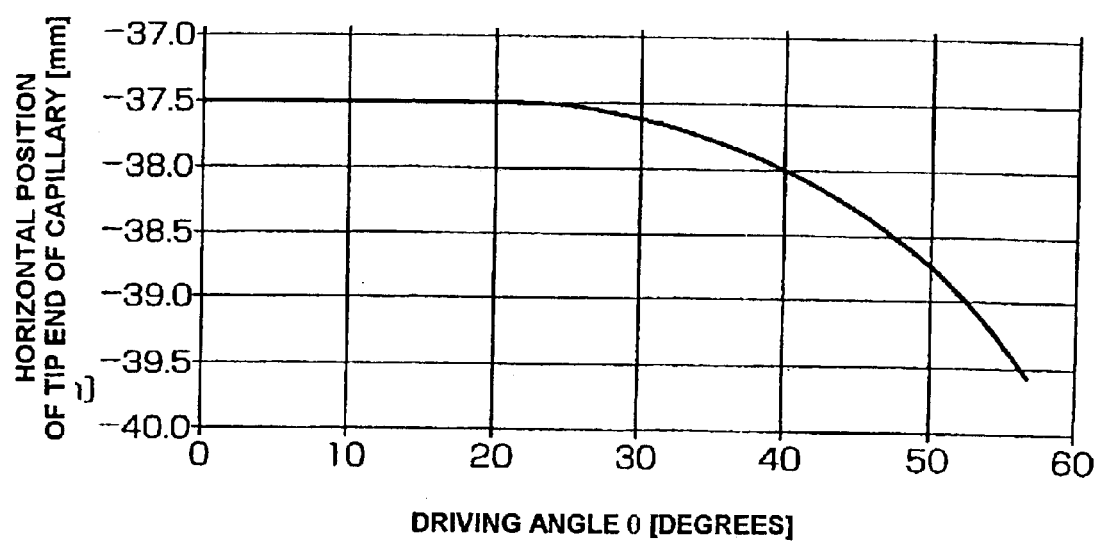
FIG. 8 is a graph that shows the relationship between the driving angle of the linking arm and the horizontal position of the tip end of the capillary.
Figure 9:
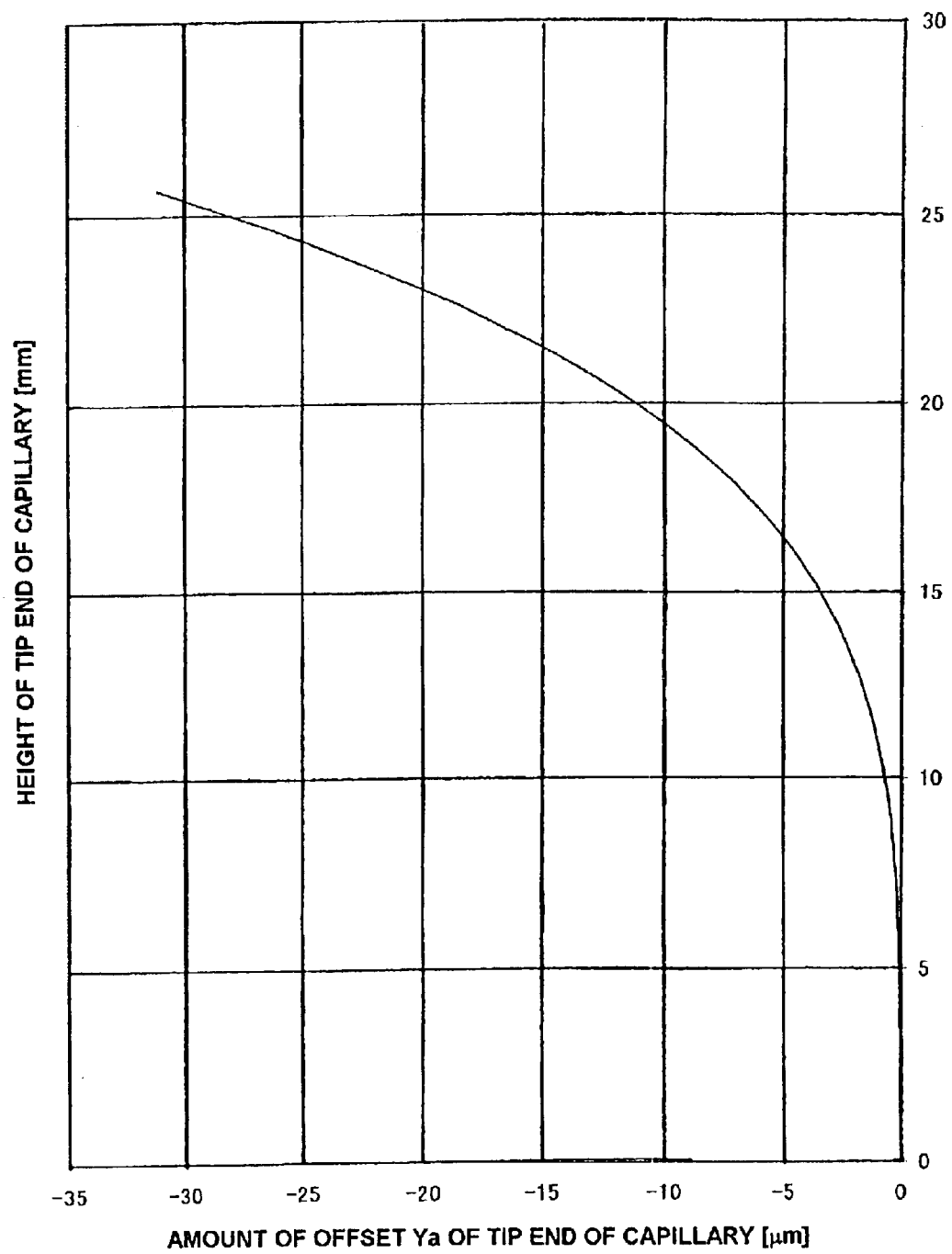
FIG. 9 is a graph that shows the relationship between the amount of offset of the tip end of the capillary in the horizontal direction and the height of the tip end of the capillary.

As one example, if L1 is set at L1=30 mm in a cases where the above-described dimensions are set in the relationship L1:L3=L3:L2=1:1.5, then L2=67.5 mm, and L3=45 mm. The relationship between the angle θ and the amount of movement (amount of offset) Ya of the capillary 21 in the horizontal direction in this case is as shown in FIG. 8. The relationship between Ya and the height Za of the tip end A of the capillary is as shown in FIG. 9. As is clear from FIG. 8, Ya of the capillary 21 is approximately 5 μm if θ is within 13 degrees. As is clear from FIG. 9, Ya is 5 μm if Za is 0 to 17 mm, so that the capillary 21 is moved approximately vertically.

As seen from the above, the bonding apparatus of the present invention includes:

a horn holder in which one end of this horn holder has a first connecting portion that is movable in the horizontal direction and is connected to a bonding head in a pivotable fashion and another end of the horn holder is inclined downward and forward, an ultrasonic horn which has a capillary at its one end and is held by the horn holder, a linking arm in which one end of this linking arm has a second connecting portion that is connected to the horn holder in a pivotable fashion and another end of the linking arm has a third connecting portion that is connected to the bonding head so that the third connecting portion is pivotable with respect to the bonding head, and a driving motor which moves the first connecting portion horizontally or causes the third connecting portion to pivot.

Accordingly, the horn holder, linking arm, supporting shaft and driving motor, etc. are disposed above the ultrasonic horn, so that no constituting elements that support or drive the ultrasonic horn are present on the horizontal plane of the tip end of the capillary, i.e., on the horizontal plane of the bonding surface of the workpiece. Consequently, it is possible to perform bonding on a workpiece that has a large bonding area.

Furthermore, in the above structure, the second connecting portion is disposed on an imaginary line that connects the tip end of the capillary and the first connecting portion, and the third connecting portion is disposed on a imaginary horizontal line that passes through the first connecting portion; and a relationship L1=L2=L3 is established, in which L1 is a distance between the third connecting portion and the second connecting portion, L2 is a distance between the second connecting portion and the tip end of the capillary, and L3 is a distance between the second connecting portion and the first connecting portion.

Accordingly, the capillary can be moved upward and downward perpendicularly with respect to a bonding surface. When the relationship L1:L3=L3:L2 is established, the capillary is moved upward and downward substantially perpendicularly with respect a the bonding surface.

What is claimed is:

1. A bonding apparatus comprising:

a horn holder, one end of said horn holder having a first connecting portion that is movable in a horizontal direction and is pivotably connected to a bonding head so that said first connecting portion is pivotable, and another end of said horn holder being inclined downward and forward, an ultrasonic horn which has a capillary at one end thereof and is held by said another end of said horn holder, a linking arm, one end of said linking arm having a second connecting portion that is pivotably connected to said another end of said horn holder so that said second connecting portion is pivotable, and another end of said linking arm having a third connecting portion that is pivotably connected to said bonding head so that said third connecting portion is pivotable with respect to said bonding head, and a driving motor which moves horizontally for moving said first connecting portion horizontally and causing said third connecting portion to pivot; wherein said second connecting portion is disposed on an imaginary line that connects a tip end of said capillary and said first connecting portion, said third connecting portion is disposed on an imaginary horizontal line that passes through said first connecting portion, and a relationship L1=L2=L3 is established, in which L1 is a distance between said third connecting portion and said second connecting portion, L2 is a distance between said second connecting portion and said tip end of said capillary, and L3 is a distance between said second connecting portion and said first connecting portion.

2. A bonding apparatus comprising:

a horn holder, one end of said horn holder having a first connecting portion that is movable in a horizontal direction and is pivotably connected to a bonding head so that said first connecting portion is pivotable, and another end of said horn holder being inclined downward and forward, an ultrasonic horn which has a capillary at one end thereof and is held by said another end of said horn holder, a linking arm, one end of said linking arm having a second connecting portion that is pivotably connected to said another end of said horn holder so that said second connecting portion is pivotable, and another end of said linking arm having a third connecting portion that is pivotably connected to said bonding head so that said third connecting portion is pivotable with respect to said bonding head, and a driving motor which moves horizontally for moving said first connecting portion horizontally and causing said third connecting portion to pivot;

wherein said second connecting portion is disposed on an imaginary line that connects a tip end of said capillary and said first connecting portion, said third connecting portion is disposed on an imaginary horizontal line that passes through said first connecting portion, and a relationship L1:L3=L3:L2 is established, in which L1 is a distance between said third connecting portion and said second connecting portion, L2 is a distance between said second connecting portion and said tip end of said capillary, and L3 is a distance between said second connecting portion and said first connecting portion.

3. The bonding apparatus according to claim 1, further comprising an initial position setting means that allows an initial position of said first connecting portion or of said third connecting portion which are driven by said driving motor to be set freely.

4. The bonding apparatus according to claim 2, further comprising an initial position setting means that allows an initial position of said first connecting portion or of said third connecting portion which are driven by said driving motor to be set freely.

5. The bonding apparatus according to claim 3, wherein said initial position setting means is comprised of:

an initial position detection member which is disposed on a member that is driven together with said first connecting portion or said third connecting portion, and a sensor which is provided on said bonding head at a position that corresponds to said initial position detection member.

6. The bonding apparatus according to claim 4, wherein said initial position setting means is comprised of:

an initial position detection member which is disposed on a member that is driven together with said first connecting portion or said third connecting portion, and a sensor which is provided on said bonding head at a position that corresponds to said initial position detection member.

* * * * *